United States Patent [19]

Verkuil

[11] 4,015,203
[45] Mar. 29, 1977

[54] CONTACTLESS LSI JUNCTION LEAKAGE TESTING METHOD

[75] Inventor: Roger Leonard Verkuil, Poughkeepsie, N.Y.

[73] Assignee: International Business Machines Corporation, Armonk, N.Y.

[22] Filed: Dec. 31, 1975

[21] Appl. No.: 645,759

[52] U.S. Cl. .............................. 324/158 D; 324/40; 250/211 J
[51] Int. Cl.$^2$ .................. H01J 39/12; G01R 31/00
[58] Field of Search .................. 250/211 J, 211 R; 324/158 D, 158 T, 40 R; 357/14

[56] References Cited
UNITED STATES PATENTS

| | | | |
|---|---|---|---|
| 2,859,407 | 11/1958 | Henisch | 324/40 |
| 3,745,454 | 7/1973 | Nikirk et al. | 324/158 D |
| 3,798,539 | 3/1974 | Brooks et al. | 324/40 |
| 3,829,881 | 8/1974 | Kohashi | 357/14 |

OTHER PUBLICATIONS

"Simple Contactless Method For Measuring Decay Time of Photoconductivity In Silicon" Lichtenstein et al., Review of Scientific Instruments, vol. 38, 1/67, p. 133.

"Measurement of Carrier Lifetimes" Stevenson and Keyes Journal of Applied Physics, vol. 26, No. 2, Feb. 55, pp. 190–194.

Primary Examiner—Alfred E. Smith
Assistant Examiner—David K. Moore
Attorney, Agent, or Firm—Robert J. Haase

[57] ABSTRACT

An inductively coupled oscillator method for inducing eddy currents in a semiconductor PN junction wafer while irradiating said wafer with pulsed light of selected intensity. The oscillator loading due to the pulsed light modulated eddy current losses is monitored and displayed on an oscilloscope in the form of a decay time plot of voltage amplitude, the plot being a function of the pulsed light intensity and the recombination rate of light-induced electrons and holes on each side of the junctions. The leakage characteristics of the junctions which are desired to be measured are one of the factors determining said rate. Leakage characteristic is made the predominant factor by setting the intensity of the pulsed light to a value which produces a nearly straight line decay time plot on the oscilloscope display. The slope of the line then is a measure of the leakage characteristic.

5 Claims, 6 Drawing Figures

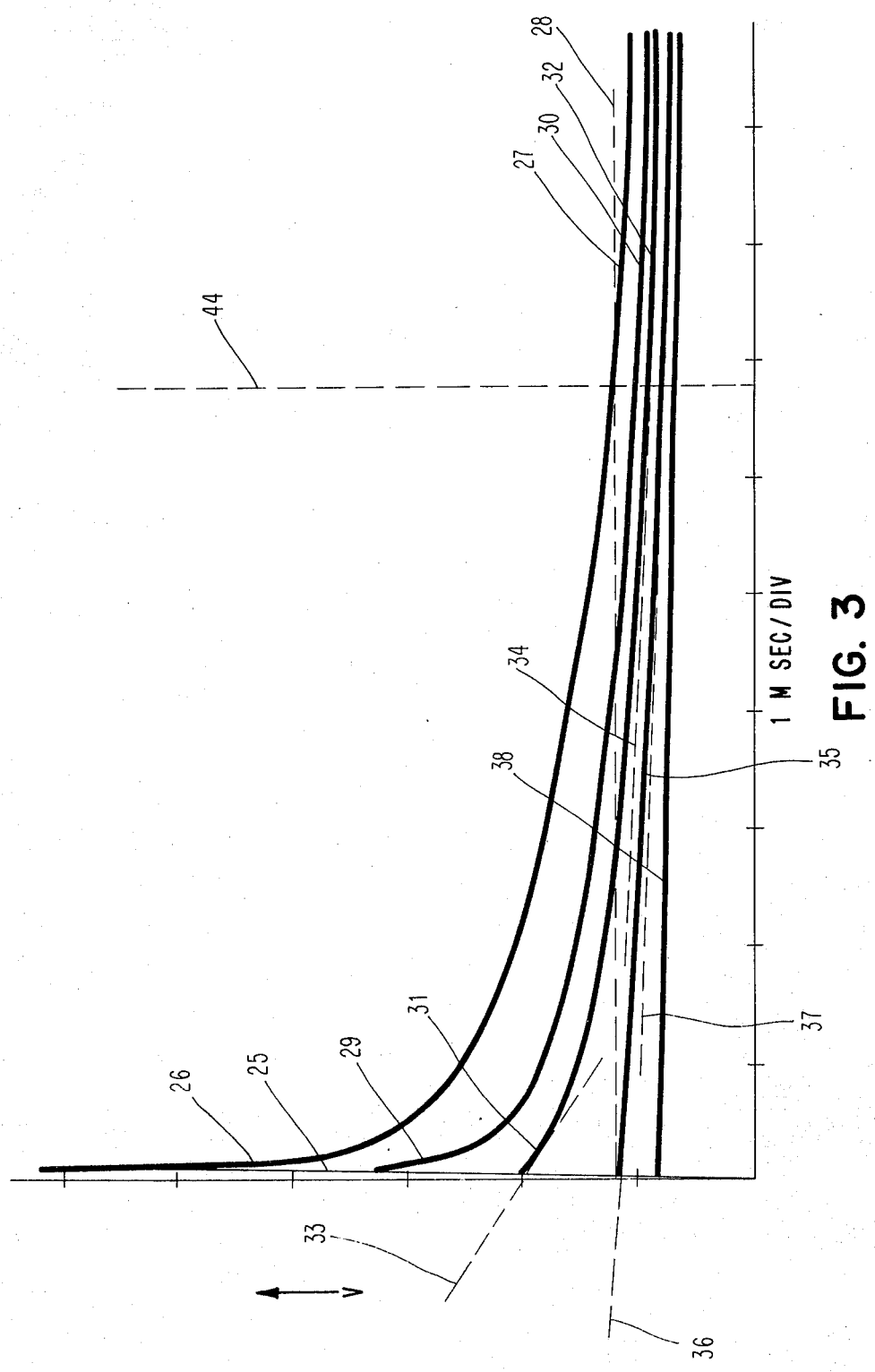

CONTACTLESS LSI JUNCTION LEAKAGE TESTING METHOD

BACKGROUND OF THE INVENTION

The invention generally relates to methods for testing for the presence of imperfections in semiconductor specimens and, more particularly to a contactless method for measuring PN junction leakage.

DESCRIPTION OF THE PRIOR ART

Contactless methods for measuring the decay time of bulk semiconductor materials are known in the art. For example, the paper "Contactless Measurement of Resistivity of Slices of Semiconductor Materials" by Nobuo Miyamoto et al, Review of Scientific Instruments, Vol. 38, No. 3, March 1967, page 360, discloses a high frequency capacitively coupled technique whereas the paper "Simple Contactless Method for Measuring Decay Time of Photoconductivity in Silicon" by R. M. Lichtenstein et al, Review of Scientific Instruments, Vol. 38, No. 1, January 1967, page 133, deals with a high frequency inductively coupled technique. Both techniques monitor the amplitude of oscillation of a high frequency carrier which is capacitively or inductively coupled, respectively, to the semiconductor sample while the sample is irradiated with pulsed light. Each pulse of light excites electrical carriers which temporarily increase the loading on the high frequency oscillator and cause a corresponding temporary decrease in the amplitude of oscillations. When the light pulse terminates, the amplitude of oscillations returns to its steady state value at a rate determined by the carrier recombination rate of the irradiated sample.

A more complicated situation exists when one or more junctions are present in the sample under test. High frequency oscillations which are capacitively coupled into the irradiated PN junction-containing specimen are substantially uneffected by the presence of the junctions. That is, the presence of the junctions does not significantly change the loading on the capacitively coupled high frequency oscillator. On the other hand, an inductively coupled high frequency oscillator experiences significant change in loading due to the presence of junctions in the semiconductor specimen under test. However, if the intensity of the pulsed light irradiating the specimen is maintained at relatively high values, consistent with prior art intensity levels, the loading of the inductively coupled oscillator attributable to the leakage associated with the PN junctions is not accurately detectable.

SUMMARY OF THE INVENTION

PN junction leakage in a semiconductor specimen including large scale integration specimens is measured by inductively coupling high frequency oscillations to the specimen while the specimen is subjected to pulsed light of selected intensity. The capacitance of the junction or junctions in the sample is charged to an amount dependent on the intensity of the pulsed light. When each light pulse terminates, the junction capacitance discharges at a rate determined by the existing discharge path impedance.

Each junction can be equivalently represented by a leakage resistor and a rectifying diode connected in shunt across a junction capacitor. The impedance of the diode is small relative to the leakage impedance when the diode is conducting. The impedance of the diode is high relative to the leakage impedance when the diode is not conducting, i.e., when the forward voltage across the diode is insufficient to overcome the conduction threshold.

It has been found that when the intensity of the pulsed light irradiating the junction specimen is set at a value insufficient to charge the junction capacitance to an amount causing forward conduction of the junction diode, the discharge of the junction capacitance following the termination of the pulse light is determined substantially solely by the leakage impedance of the junction. Such a setting of the light intensity is achieved in accordance with the present invention by observing a decay time plot of the discharge of the junction capacitance and reducing the amplitude of the light pulse until the ratio of the initial slope of the decay time plot relative to the terminal slope of the decay time plot portion attributable to leakage discharge is less than about 2:1.

BRIEF DESCRIPTION OF THE DRAWING

FIG. 3 is a representative superimposed series of decay time plots produced by the apparatus of FIG. 1;

DESCRIPTION OF THE PREFERRED EMBODIMENT

Production yield in high density large scale integration transistor processing is adversely effected by the presence of crystallographic defects which create "pipes" or undesired pathways between collector and emitter along which impurities diffuse to produce collector to emitter leakage resistance. It is important that such crystallographic defects be detected at an early stage before completion of LSI transistor devices to minimize any production investment in unacceptable devices.

A semiconductor PN junction may be represented by the equivalent circuit consisting of three elements connected in parallel with each other, i.e., a capacitor representing junction capacitance, a diode representing the rectification properties of the junction, and a resistor representing the leakage resistance of the junction. It has been observed that there is a correlation between the existance of collector to emitter pipes and high junction leakage. The two effects are related to the same crystallographic defects. According to the present invention, junction leakage is used as a predictor of pipes.

Figure 1:
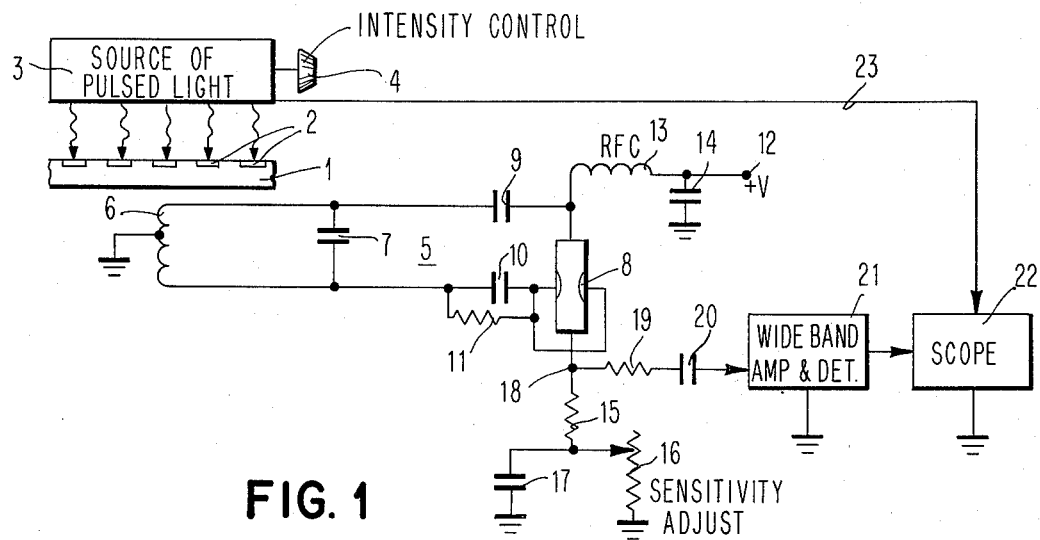
FIG. 1 is a simplified schematic circuit diagram of a preferred embodiment of the invention.

Referring to FIG. 1, a high density, large scale integrated semiconductor wafer 1 having PN junctions 2 is irradiated by a source of pulsed light 3. The intensity of light 3 is adjustable by control 4. High frequency oscillator 5, preferably operating at a frequency in the range from about 50 to about 200 megahertz, is inductively coupled to wafer 1 via tank coil 6. The resonant tank circuit is completed by capacitor 7. Coil 6 is center tapped to ground to minimize undesired stray noise pick-up in the coil. Oscillator 5 further comprises junction field effect transistor 8 which is coupled to the tank circuit by capacitors 9 and 10 and resistor 11. FET 8 is coupled to positive voltage terminal 12 by radio frequency choke 13 and high frequency bypass capacitor 14. FET 8 is connected to ground via unbypassed resistor 15 and a bias control comprising rheostat 16 and capacitor 17. Rheostat 16 is designated "sensitivity adjust" consistent with its function in optimizing the sensitivity of oscillator 5 to the loading effect of PN junction wafer 1 on the resonant tank circuit comprising coil 6 and capacitor 7.

The amplitude of the carrier oscillations produced by oscillator 5 is modulated upon the occurrence of pulse light from source 3. The amplitude modulated carrier, available at node 18, is coupled by resistor 19 and capacitor 20 to wide band inverting amplifier and detector 21. The detected signal is applied to scope 22 whose trace is synchronized by pulses from source 3 applied via line 23. A synchronizing pulse occurs on line 23 each time that light source 3 is pulsed.

Eddy currents are induced in wafer 1 by the inductively coupled oscillations from oscillator 5. The amplitude of oscillations of oscillator 5 is inversely related to the magnitude of the eddy current losses in wafer 1. The magnitude of the eddy current losses, in turn, is related to the amount of work done by the electric field associated with the induced eddy currents in moving charges through a distance in wafer 1.

Figure 2:
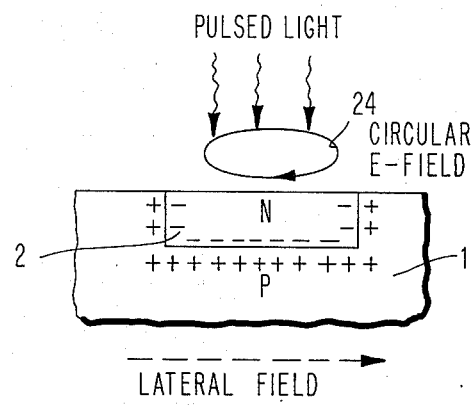
FIG. 2 is a cross-section view of a PN junction semiconductor specimen irradiated by pulsed light.

Referring to FIG. 2, charges are induced adjacent junction 2 in wafer 1 each time that the wafer receives a pulse of light. The charges are distributed as indicated in FIG. 2 in a direction tending to forward bias the PN junction as is well understood. The photoinduced charges recombine after the termination of the light pulse at rates determined by the RC time constant of the available discharge path. The charges are stored by the junction capacitance whereas the discharge resistance is provided by the forward conduction resistance of the equivalent junction diode (if the stored charges are sufficient to forward bias the diode) and by the leakage impedance of the junction (if the stored charges are insufficient to forward bias the diode). In general, each light pulse charges the junction capacitance by an amount determined by the intensity of the light pulse and the junction capacitance discharges at a relatively fast initial rate if and so long as junction diode is biased into a forward conduction mode. Upon the cessation of the forward conduction of the equivalent junction diode, the residual charge on the equivalent junction capacitance continues to fall but at a significantly reduced rate. In accordance with the present invention, the intensity of the pulsed light is adjusted to induce an initial charging of the equivalent junction capacitance to a value just below the value required to forward bias the equivalent junction diode. As will be discussed later in connection with FIG. 3, such a setting of the intensity of the pulsed light provides a voltage time plot on scope 22 of FIG. 1 which represents substantially solely the leakage characteristic of the PN junctions 2 in wafer 1 which is desired to be measured.

Referring again to FIG. 2, it is necessary that the electric field impressed on wafer 1 by the inductively coupled oscillations from oscillator 5 be directed along a path which causes substantial movement of the negative and positive charges induced by the pulsed light. The work expended by moving the induced charges through a distance along the impressed electric field causes a loading effect on the oscillations from oscillator 5, i.e., the greater the distance of movement of the charges along the impressed electric field, the greater the loading of oscillator 5. The greater the loading of the oscillator, the more easily the recombination rate of the photoinduced charges can be seen above the electrical noise level, on the voltage decay time plot provided by scope 22.

It is believed that the loading effect is maximized in accordance with the present invention by the provision of circular electric fields such as field 24 of FIG. 2 associated with the induced eddy currents created by the inductively coupled oscillations from oscillator 5. Oscillating E-field 24 lies in a plane parallel to the major surfaces of wafer 1 and of junction 2. As a result of this parallel relationship, the positive and negative charges contiguous to junction 2 freely oscillate in opposite parallel directions. It is believed that the distance through which the negative and positive charges travel would be significantly reduced for a given magnitude of electric field if the electric field were of linear rather than circular direction as shown in FIG. 2. A linear electric field could be provided, for example, by a capacitively coupled oscillator in contrast to the inductively coupled oscillator depicted in FIG. 1. A linear electric field would tend to separate the negative and positive charges from each other. Such separation would be resisted with the result that the positive and negative charges actually would travel through relatively short distances and produce insignificant loading effect. In any event, it has been found experimentally that the sensitivity of an inductively coupled oscillator to the decay of the photoinduced charges following each light pulse is significantly greater than the sensitivity of a capacitively coupled oscillator to the same charge decay. It is particularly important to maximize loading sensitivity because reduced intensity of the pulse light is required for increasing the accuracy of the junction leakage measurement as will now be explained in connection with FIG. 3.

FIG. 3 is a representative superimposed series of individual traces produced on scope 22 of FIG. 1 for respective intensities of pulsed light irradiating wafer 1 as shown in FIG. 1. Each of the superimposed traces is characterized by a leading edge 25 which rises in response to the pulsed light to an amplitude directly related to the intensity of the pulsed light. Assuming for the sake of discussion that control 4 is adjusted to produce a relatively high intensity of the pulsed light, the junction capacitance is charged to a relatively high value to forward bias the junction diode. Upon the termination of the light pulse, the junction capacitance discharges at a relatively high initial rate determined by the relatively low forward conduction resistance of the junction diode. The initial relatively rapid discharge is represented by the steeple falling portion 26 of the trace on scope 22. When the discharge has proceeded to a point where the residual charge on the junction capacitance is insufficient to forward bias the junction diode, the remaining discharge proceeds at the relatively low decay rate represented by terminal portion 27 of the time plot. The term "terminal portion" is defined as those portions of the displayed decay time plots which occur at the time when the displayed plot having the highest initial amplitude 25 has decayed to about 20% of its initial amplitude. Said time is represented by dashed line 44.

Dashed line 28 is added to the decay time plots of FIG. 3 for reference purposes to designate the points at which the forward conduction of the effective junction diode ceases. It is to be noted that the slope of portion 26 of the decay time plot is determined primarily by the forward conducting junction diode and is of no interest to the present invention. Moreover, the presence of portion 26 detracts from the accuracy with which desired portion 27 can be measured. It is necessary to eliminate portion 26 in order to provide the best resolution of the portion which relates to the junction leakage characteristic to be measured.

The manner in which portion 26 is diminished in the voltage time plot displayed by scope 22 can be understood by reference to the remaining decay time traces depicted in FIG. 3. If control 4 is adjusted to decrease the intensity of the pulsed light source relative to the intensity producing trace portions 26 and 27, a second trace with lower initial amplitude is displayed having a rising edge portion conforming to trace portion 25 and a trailing edge having a relatively steeply falling initial portion 29 and a less steeply falling terminal portion 30. Similarly, a further reduction in the amplitude in the pulsed light produces a third trace having trailing edge portions 31 and 32. It will be noted that in each of the three traces just described, the intensity of the pulsed light is sufficient to charge the junction capacitance to an initial value overcoming the forward conduction threshold of the junction diode.

Of particular significance is the ratio of the slope of the initial portion of a given trace to the slope of the terminal portion of the same trace. Dotted line 33 represents the slope of the initial trace portion 31 while dotted line 34 represents the slope of the terminal trace portion 32 produced by the lowest of the three pulsed light intensities discussed above. The ratio of the slope represented by dashed line 33 to the slope represented by dashed line 34 is in excess of 20:1. A further reduction in the intensity of the pulsed light from source 3 produces decay time trace 35 whose initial slope is represented by dashed line 36 and whose terminal slope is represented by dashed line 37. In the case of trace 35, the intensity of the pulsed light is insufficient to charge the junction capacitance to a value overcoming the forward conduction threshold of the junction diode. Accordingly, there is no abruptly falling portion of the decay trace attributable to the low discharge resistance presented by a forward conducting diode. Rather, the entire discharge of the charged junction capacitance is through the leakage resistance of the junction which discharge proceeds at the relatively low initial rate represented by dashed line 36 and at the even lower terminal rate represented by dashed line 37.

Figure 4:
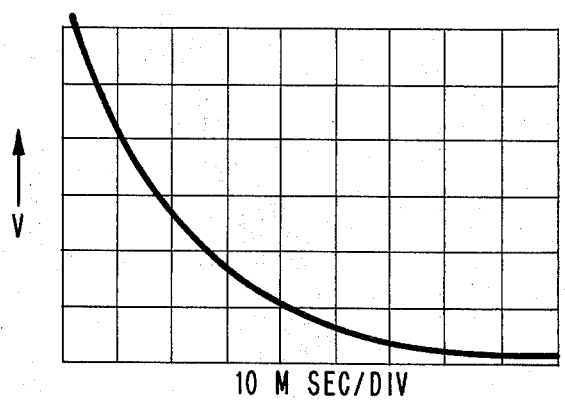
FIG. 4 shows one of the plots of FIG. 3 in its entirety.

Further reduction in the amplitude of the pulsed light produces trace 38 which, like trace 35, decays at a very low rate determined by the junction leakage characteristic. Although trace 38 is as accurate as trace 35 in its depiction of the junction leakage characteristic, trace 38 is less desirable than trace 35 inasmuch as trace 38 is of reduced amplitude and more difficult to observe when extraneous noise signals are present in the signal applied to scope 22 by wide band amplifier and detector 21 of FIG. 1. In general, any trace having a ratio of initial slope to terminal slope less than about 2:1 has been found to be useful. The ratio of initial slope represented by dashed line 36 to terminal slope represented by dashed line 37 is about 2:1. Accordingly, in the operation of the apparatus represented in FIG. 1, intensity control 4 is adjusted until there is observed on the face of scope 22 a decay time trace similar to trace 35 where the ratio of the initial slope to the terminal slope is no greater than about 2:1. Preferably, the intensity control is adjusted to produce the maximum pulsed light intensity meeting the aforementioned slope ratio criterion. A sizing of junction leakage then can be obtained making a standard lifetime measurement on the displayed trace, i.e., measuring the elapsed time for the trace to decay to 37½% of its initial value. Such a measurement is facilitated by increasing the vertical gain setting and decreasing the sweep rate setting of scope 22 so that the entirety of the displayed trace can be readily observed as depicted in FIG. 4. The curve of FIG. 4 corresponds to curve 35 of FIG. 3.

Semiconductor wafers having junctions exhibiting unacceptably high leakage are easily recognized in the practice of the present invention in that they will not exhibit the characteristic abrupt reduction (possessed by low leakage wafers) in the initial slope of the decay trace such as may be seen by comparing the slopes of dashed lines 33 and 36 which occurs as the intensity of the pulsed light is reduced through a value which no longer causes the forward conduction of the junction diode.

Figure 5:
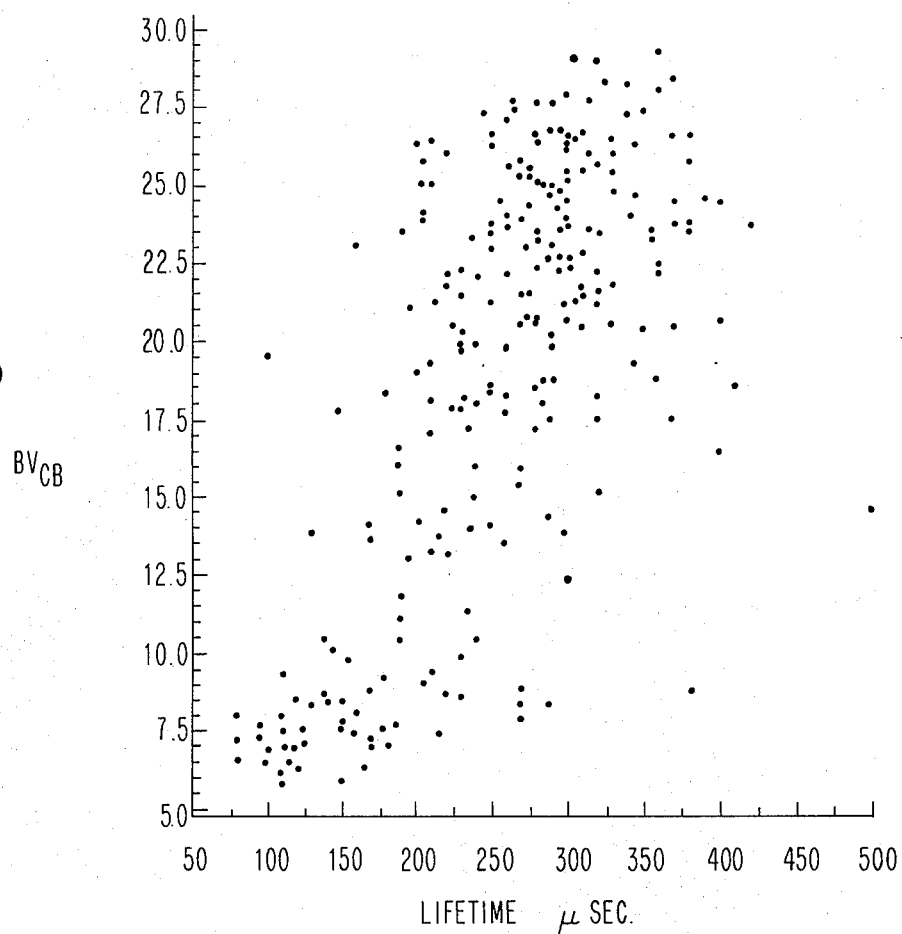
FIG. 5 is a plot showing the correlation of decay time data obtained in accordance with the present invention and premature junction breakdown data.

Experimental evidence has been obtained showing good correlation between junction leakages measured by the decay time trace technique of the present invention and premature junction breakdown voltage measurements on a sampling of 258 wafers containing PN junctions. Each wafer was subjected to a junction breakdown voltage test and to the decay time trace test of the present invention. Each dot in the plot of FIG. 5 represents the breakdown voltage observed on a given wafer and the time designated "lifetime" for the decay trace obtained from the same wafer to fall to 37½% of its initial (peak) amplitude following the cessation of a light pulse. The experimental results of FIG. 5 can be more easily appreciated by reference to the plot of FIG. 6 which summarizes the data represented in FIG. 5.

Figure 6:
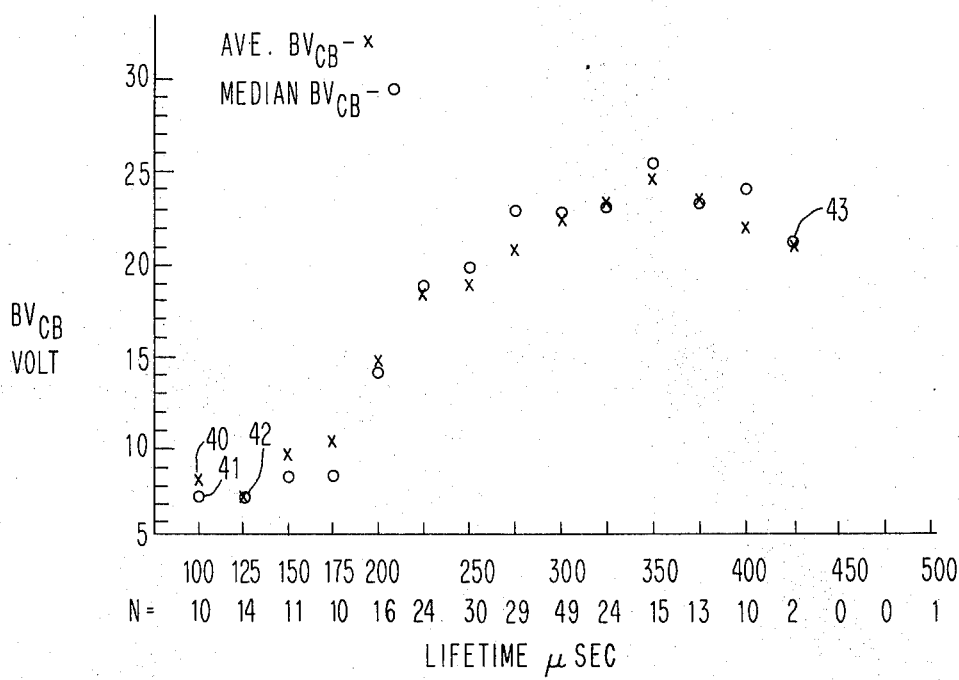
FIG. 6 is a summarized plot of FIG. 4.

Each point represented by an X in FIG. 6 represents the average value of the points of FIG. 5 surrounding a respective lifetime value. For example, the 10 points plotted around the lifetime value of 100 microseconds are averaged and plotted on FIG. 6 as point 40. Similarly, the median value of the same ten dots of FIG. 5 are represented by the single circle 41 of FIG. 6. The other points on FIG. 6 are plotted in a similar manner. In the case of point 42 and 43, the median and average values coincide. The number of samples represented by each of the points on FIG. 6 is shown below the respective lifetime value. Measurements on a total of 258 wafers are represented in the plots of FIGS. 5 and 6. The plotted data shows that the junction leakage measurement provided in accordance with the present invention correlates well with premature junction breakdown voltage, the latter of which is recognized in the art as an indicator of pipe defects in transistor wafers.

It will be observed that the technique of the present invention averages the junction leakage behavior of all junctions on a given LSI wafer without requiring any physical contact to the wafer. The non-destructive test nature of the technique allows its use on product wafers at many different times during their fabrication as desired.

While the invention has been particularly shown and described with reference to the preferred embodiment thereof, it will be understood by those skilled in the art that various changes in form and details may be made therein without departing from the spirit and scope of the invention.

What is claimed is:

1. A method for testing PN junctions in a wafer comprising:
    irradiating said wafer with pulsed light of selected intensity to charge the capacitance of the junction in a direction tending to render said junction forwardly conductive,
    said junction having a forward conduction threshold,
    inductively coupling to said wafer high frequency oscillations for inducing eddy currents in said wafer,
    said oscillations becoming amplitude modulated each time said wafer receives a pulse of said light, and
    monitoring said amplitude modulation while varying the intensity of said pulsed light to determine a value of said pulsed light which charges said capacitance to a value beneath said threshold.

2. The method defined in claim 1 wherein said amplitude modulation is monitored while varying the intensity of said pulsed light to determine the maximum value thereof which charges said capacitance to a value beneath said threshold.

3. The method defined in claim 1 wherein said amplitude modulation is monitored by producing an oscilloscope decay time trace related to said amplitude modulation while varying the intensity of said pulsed light to determine a value thereof which causes the ratio of the initial slope of said trace to the terminal slope of said trace to be no greater than about 2:1.

4. The method defined in claim 1 wherein said amplitude modulation is monitored by producing an oscilloscope decay time trace related to said amplitude modulation while varying the intensity of said pulsed light to determine the maximum value thereof which causes the ratio of the initial slope of said trace to the terminal slope of said trace to be no greater than about 2:1.

5. A PN junction wafer manufacturing process wherein the method defined in claim 1 is utilized at a plurality of different times during said process.

* * * * *